United States Patent
Gunderson et al.

(10) Patent No.: US 8,305,770 B2
(45) Date of Patent: Nov. 6, 2012

(54) PCBA LOW COST FRAME MOUNT

(75) Inventors: Neal Frank Gunderson, Lake Elmo, MN (US); Wolfgang Rosner, Burnsville, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 171 days.

(21) Appl. No.: 12/694,745

(22) Filed: Jan. 27, 2010

(65) Prior Publication Data

US 2011/0182045 A1   Jul. 28, 2011

(51) Int. Cl.
*H05K 7/02* (2006.01)
(52) U.S. Cl. .... 361/807; 361/757; 361/737; 361/679.01
(58) Field of Classification Search .................. 361/807, 361/737, 757, 751, 679.01, 748
See application file for complete search history.

(56) References Cited

U.S. PATENT DOCUMENTS

| | | | |
|---|---|---|---|
| 3,304,109 A | 2/1967 | Schuster | |
| 4,470,737 A | 9/1984 | Wollar | |
| 4,842,508 A | 6/1989 | Boskovic | |
| 5,291,368 A * | 3/1994 | Conroy-Wass | ............... 361/796 |
| 5,419,667 A | 5/1995 | Avgoustis | |
| 5,709,513 A | 1/1998 | Tsai | |
| 6,215,074 B1 | 4/2001 | Good et al. | |
| 6,385,036 B1 | 5/2002 | Chien | |
| 6,556,433 B1 | 4/2003 | Love et al. | |
| 6,639,796 B2 | 10/2003 | Cannon | |
| 6,826,045 B2 | 11/2004 | Chen | |
| 7,125,231 B1 | 10/2006 | Kuhn | |
| 7,301,776 B1 | 11/2007 | Wang et al. | |
| 7,517,231 B2 | 4/2009 | Hiew et al. | |
| 2008/0038877 A1 | 2/2008 | Wang et al. | |
| 2008/0049949 A1 * | 2/2008 | Snider et al. | ..................... 381/86 |
| 2008/0266816 A1 * | 10/2008 | Ni et al. | ....................... 361/737 |

* cited by examiner

*Primary Examiner* — Yuriy Semenenko
*Assistant Examiner* — Andargie M Aychillhum
(74) *Attorney, Agent, or Firm* — Hall Estill Attorneys at Law

(57) ABSTRACT

Various embodiments of the present invention are directed to a printed circuit board assembly having a circuit board with opposing side edges and an open frame housing that has first and second parallel elongated mounting frames extending along the respective side edges of the circuit board. Each mounting frame has an elongated body portion forming a channel extending the length of the body, the channel serving to nest one of the side edges of the circuit board. The body of each mounting frame has one or more sets of orthogonally disposed, intersecting mounting holes that permit use of mounting holes to accommodate screws for attaching the mounting frames in a rack frame of a host system so that the circuit board is optionally supported in a side attached mode or in a bottom attached mode.

12 Claims, 3 Drawing Sheets

PCBA LOW COST FRAME MOUNT

SUMMARY

Various embodiments of the present invention are directed to a printed circuit board assembly having a circuit board with opposing side edges and an open frame housing that has first and second parallel elongated mounting frames that extend along respective side edges of the circuit board. Each mounting frame has an elongated body portion forming a channel extending the length of the body, the channel serving to nest one of the side edges of the circuit board. The body of each mounting frame has one or more sets of orthogonally disposed, intersecting mounting holes that permit use of fasteners such as screws to attach the mounting frames in a rack frame of a host system. In this way, the circuit board is optionally supported in a side attached mode or in a bottom attached mode.

In one embodiment the orthogonally disposed, intersecting mounting holes are taper walled holes. In one other embodiment, the orthogonally disposed, intersecting mounting holes have entry portions that are tapered and inner portions that are threaded.

These and various other features and advantages which characterize the claimed invention will be apparent from a reading of the following detailed description and a review of the associated drawings.

DETAILED DESCRIPTION

Figure 1:
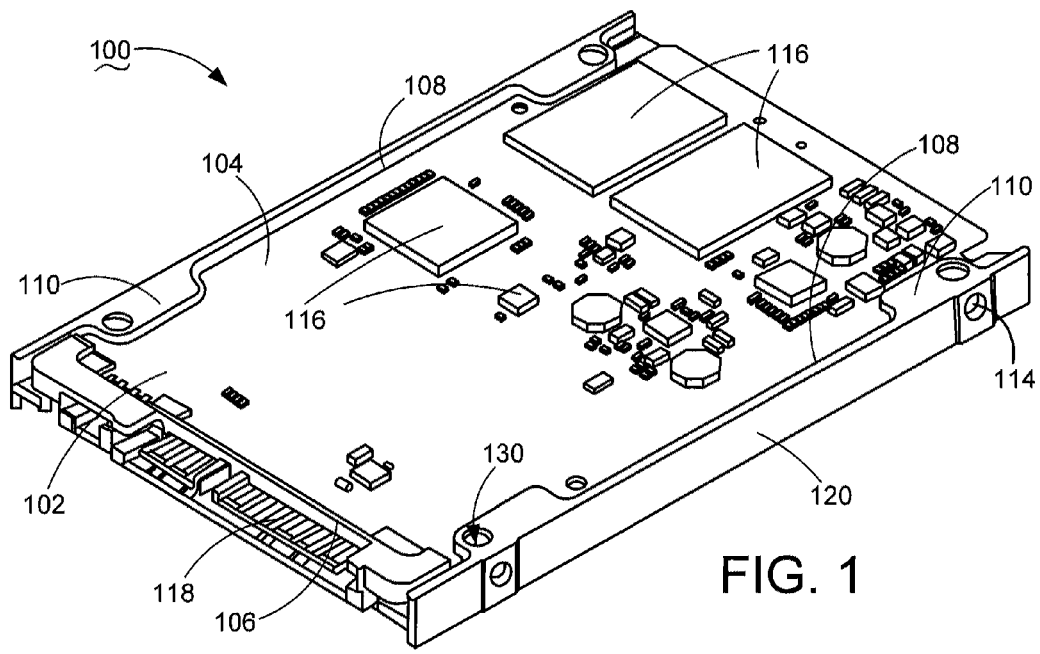
FIG. 1 is a front isometric view of a printed circuit board assembly constructed in accordance with various embodiments of the present invention.

Numerous possible variations and modifications will readily occur to the skilled artisan upon a review of the following discussion. Thus, it will be understood that the various exemplary embodiments disclosed herein are illustrative of and are not limiting to the scope of the claimed invention.

Solid state drives (sometimes referred to as SSDs) can have a significant cost per unit of memory (gigabyte, GB) disadvantage relative to disc drives. This is especially apparent for applications in notebook or netbook computers in which space becomes a premium, yet marketing pressures bear heavily on costs. A common design of an SSD for these applications has a printed circuit board assembly (sometimes referred to as a PCBA), an I/O connector and side frames for mounting the PCBA.

Apart from the connector, the side frames are the only mechanical component. It would be desirable to inexpensively mold the side frames of plastic, but the small form factor (SFF) specification for small sized SSDs currently requires four side and four bottom 3 mm (millimeter) mounting screws. The form factor specification requires that the frame mounting holes be in two orthogonal planes and of a small diameter, with a small number of available threads of fine pitch. Furthermore, the threaded holes run into each other at 90 degrees, or that is, orthogonally. All of these issues are significant difficulties for plastic molded threads.

For orthogonally disposed holes, molded in threads can readily be achieved if threads are only molded in the hole extending from only one of the two mounting planes. Orthogonally holes without molded in threads is more general in applicability, allowing solutions in both mounting planes, but this also is problematic since small diameter, self tapping screws are not industry common, and even if such were to be made available, they would be too long for the available thread depth of the small form factor application.

Threaded orthogonal intersecting holes or bores are difficult to mold and possible to mold one of the holes by making such mounting hole deeper or a through hole, which would be nonconforming to SFF applications under consideration by certain aspects of the present disclosure. It may be possible to use a rotating slide to form to mold threaded holes in one of the orthogonal holes (requiring post molding removal), but this could be a cost prohibitive. Furthermore, this solution would likely require different part numbers for each product, with different part numbers for bottom mounting holes and for side mounting holes, requiring a user to know which mounting holes would be used in a particular application. The printed circuit boards could be shipped with sets of rails, some with bottom mounting holes and others with side mounting holes, but this would also be cost prohibitive and a marketing disadvantage.

Various aspects of the present invention provide acceptable solutions for an open frame housing that can address these and other considerations. The attention of the reader is directed to the drawings in general and to FIGS. 1 and 2 in particular wherein is shown a printed circuit board assembly 100. For convenience of reference, this sometimes will be referred to herein as the PCBA 100.

The PCBA 100 has a printed circuit board 102 having a planar top surface 104, a planar bottom surface 106 and side edges 108. A pair of nominally identically constructed parallel elongated mounting frames 110 are shown respectively extending along and nesting the side edges 108. In the manner that will be described herein below, the mounting frames 110 together form an open frame housing for support of the printed circuit board 102. A rack frame 112 of a host system (not further shown) is depicted with a pair of screw members 114 extending through holes (not separately numbered) therein and engaged with holes in the mounting frames 108.

The PCBA 100, as depicted, has a plurality of electronic devices 116, such as non-volatile memory chips, mounted to one or both of the upper and bottom surfaces 104, 106, and a connector 118 is mounted to one end. The form and/or presence of such chips on the PCB are not necessarily required.

Figure 2:
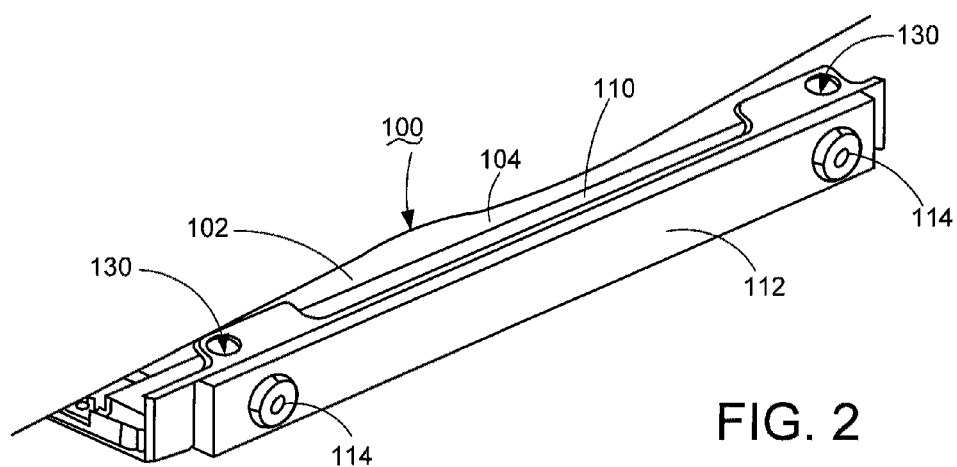
FIG. 2 is a partial isometric view of the printed circuit board assembly of FIG. 1 mounted in an edge supported mode in a rack frame of a host system.
Figure 3:
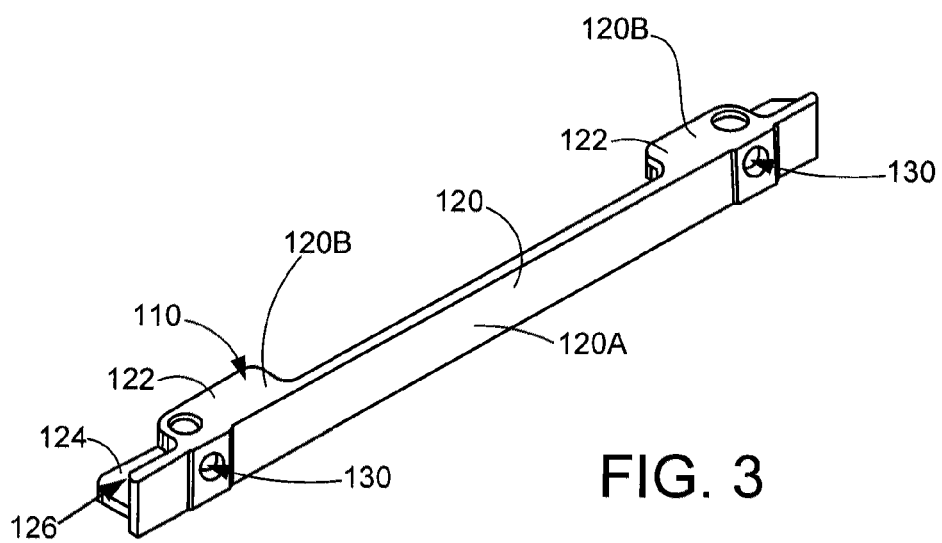
FIG. 3 is an isometric view of one of the elongated parallel mounting frames of the printed circuit board assembly of FIG. 1.
Figure 4:
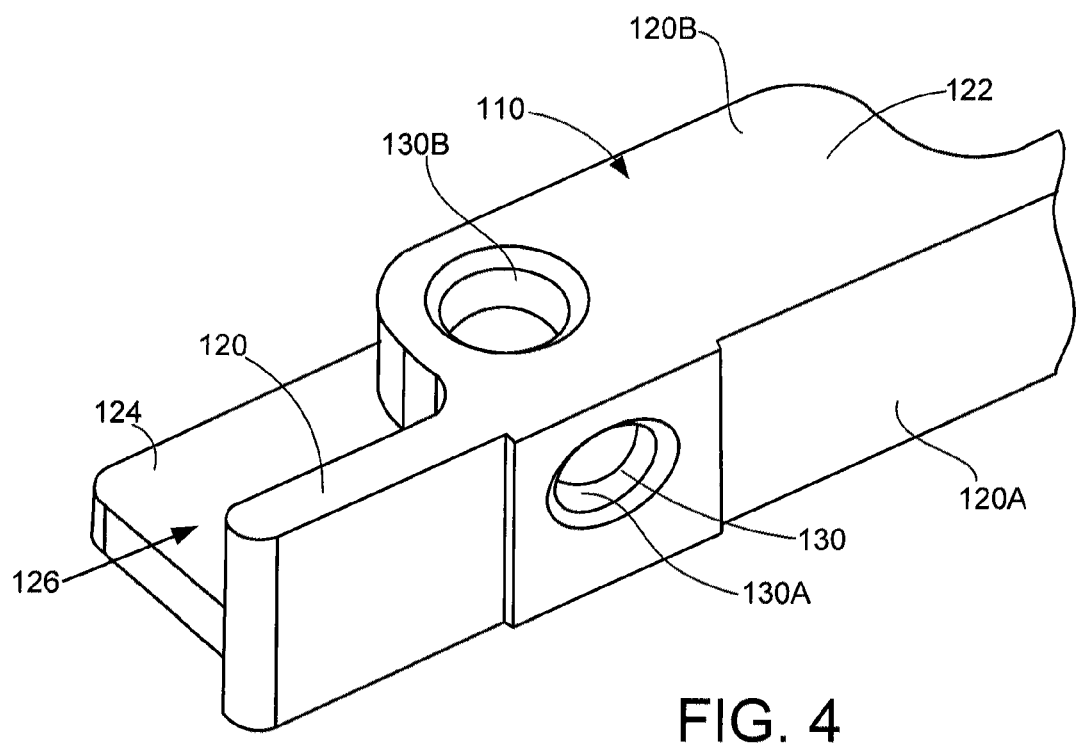
FIG. 4 is a partial, enlarged end of the mounting frame of FIG. 3 showing the multilevel implementation of aspects of the present invention featuring multiple molded-in hole levels.

With reference to FIGS. 3 and 4, it will be noted that, exemplary of an aspect of the present invention, each of the mounting frames 110 has a body portion 120 that has a pair of inwardly extending overhang protrusions 122 and a support ledge portion 124 that longitudinally extends substantially the length of the body portion 120. Between the body protrusions 122 and the support ledge 124 is a channel 126 effectively extending substantially the length of the mounting frame 110. The clearance dimension of the channel 126, defined as the distance between the body protrusions 122 and the support ledge 124, is determined to accept the thickness dimension of the printed circuit board 102 so that the side edges 108 thereof will nest in the channel 126 as shown in FIG. 1.

The body portion 120 has a first planar surface 120A and a second planar surface 120B that is substantially normal to the first planar surface 120A. In the board mounted position depicted in FIG. 1 (with the printed circuit board 102 nested in the channels 126), the first planar surface 120A is substantially normal to the planar top and bottom surfaces 104, 106, and the second planar surface 120B is substantially parallel to the planar top and bottom surfaces 104, 106.

Each mounting frame 110 has a pair of orthogonally extending bores 130 that extend through the body portion 120, each bore 130 featuring multilevel portions with the complex hole geometry of this invention. That is, each bore 130 is formed of a first mounting hole 130A in the first planar surface 120A and a second mounting hole 130B in the second planar surface 120B, the first and second mounting holes 130A, 130B being orthogonally disposed holes that extend into the body portion 120 and intersect in the manner described with regard to FIGS. 5 through 8.

Preferably, standard screws will be used with the embodiments of the present invention to self tap into the walls of the holes. However, this can present difficulties, depending on the plastic material from which the mounting frames 110 are manufactured, especially for very short screws.

Figure 5:
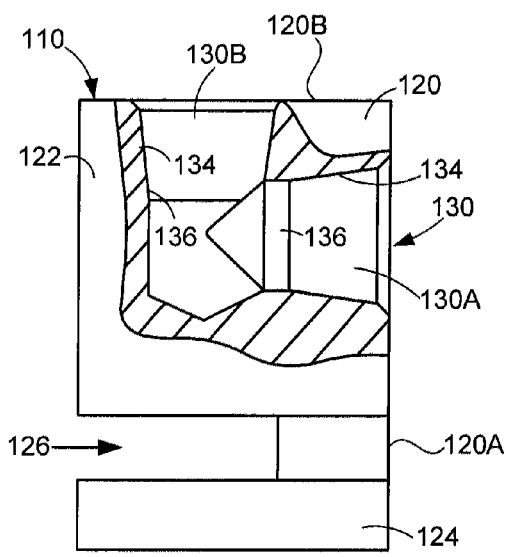
FIG. 5 is a partially cutaway, end elevation view of a preferred embodiment of the mounting frame of FIG. 3 in which the mounting holes are tapered, multilevel hole levels.

FIG. 5 shows an embodiment in which each of the mounting holes 130A and 130B of the mounting bore 130 is a multilevel hole; that is, where each mounting hole 130A, 130B has multiple molded-in levels or diameters, with each having a tapered entry portion 134 and an inner portion 136. While only two such multilevels (130A and 130B) are depicted, it will be within the scope of at least aspects of the present invention to have as many levels as deemed necessary for a particular screw at hand.

The diameter of the outer portion 134, at its smallest span, is preferably substantially equal to, or slightly larger than, the major thread diameter of the screw being used, while the inner portion 136 preferably has a diameter that is substantially equal to, or slightly less than, the minor thread diameter of the screw. With the tapered entry portion 134, the screw will be guided to the inner portion 136 where the screw can self tap the required screws to secure it in place.

Figure 6:
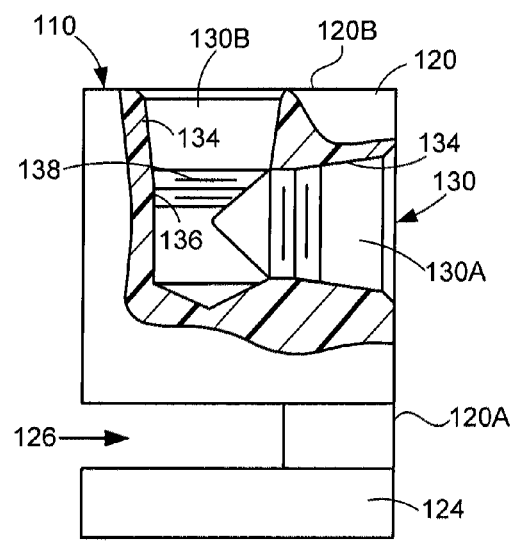
FIG. 6 is a partially cutaway, end elevation view of a preferred embodiment of the mounting frame of FIG. 3 in which the mounting holes are tapered, multilevel hole levels with the inner portion being threaded.

FIG. 6 shows an embodiment in which each of the mounting holes 130A and 130B of the mounting bore 130 has a tapered entry portion 134 and an inner portion 136 in the same manner as that of FIG. 5, but differs by having threads 138 added at the inner portion 136; the treads 138 can, if desired, be started at the inner end of the tapered entry portion 134 and continued into the inner portion 136, as may be required for an particular installation. The diameter of the outer portion 134, at its smallest span, is preferably substantially equal or slightly less than than the major thread diameter of the screw being used, while the inner portion 136 has a few full threads 138 that are engagable with the screw that is used to connect to the rack frame 112.

Figure 7:
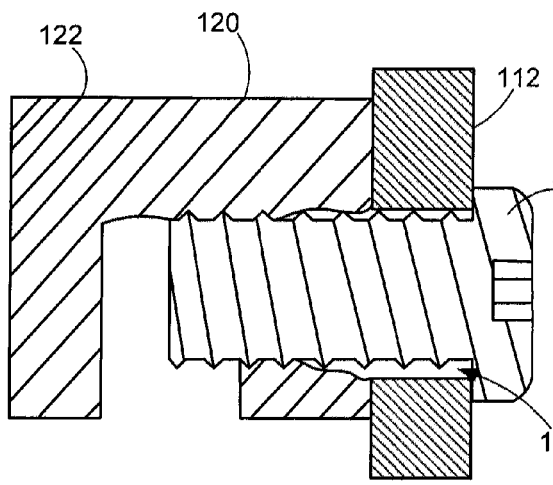
FIG. 7 is a partial, cutaway view of a screw in threaded engagement with a multilevel molded-in hole showing engagement of screw threads from light engagement near the hole entry and heavy engagement at the inner portion.

According to these aspects of the preferred embodiments, the mounting bores 130 are preferably molded tapered holes and are multilevel holes allowing entry guiding and easy starting engagement of a screw, since the top of the hole is substantially equal to or greater than the major diameter of the screw at its largest span. This is illustrated in FIG. 7 in which is depicted the screw member 114 engaged in the mounting hole 130A.

This view is a cross sectional view of the intersecting, multilevel side mounting hole for self tapping with the screw 114 attaching the mounting frame 110 to the rack frame 112. It will be noted that the hole has three different levels of engagement of the screw threads from light engagement near the entry level of the hole and with heavy thread engagement at the innermost end of the hole. That is, only in the bottom portion of the hole is the diameter smaller or substantially equal to the minor diameter of the screw such that the screw will start tapping treads as the screw has sufficiently entered the mounting hole to be uprightly set so that its longitudinal axis is substantially coincident with the central axis of the hole.

When provided in the inner portion of the hole, the threads are preferably fully formed for tight engagement with the screw so that the screw will be secured therein by application of an acceptable level of torque force and without the use of special self tapping screws. It is recognized that, with a tapered hole having only the last few threads fully formed, there may be applications where this is insufficient to prevent the threads stripping during installation, or might not provide sufficient gripping force for some ranges of op and non-op shock or vibration activities, so that it may be necessary, as mentioned above, to dimension the hole and increase the threads reach to extend further toward the entry of the hole.

Figure 8:
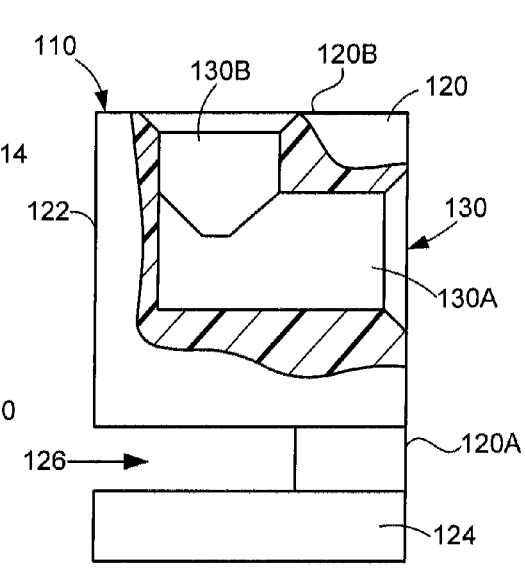
FIG. 8 is a partially cutaway, end elevation view of another embodiment in which a multilevel hole is provided for non-threaded engagement.

Another embodiment of the present invention is described with reference to FIG. 8. This embodiment facilitates some mounting applications in which, for cost and speed of assembly, screws are not used for attaching the open frame housing to a rack frame as described above. However, the mounting holes 130A, 130B are still used for the purpose of serving as locating/holding features for pins or protrusions. For such applications, the embodiment of FIG. 8 can be used, in which the mounting holes 130A and 130B are formed of substantially uniform diameter along the length of the mounting bore 130.

The multilevel implementation, according to the various embodiments of the present invention, may offer a number of benefits. It is relative easy to mold-in the complex hole geometry described herein for the mounting holes 130A and 130B of the mounting bore 130 by using a simple shaped pin supported during molding but removable by a straight pull out following molding, as that used for a cylindrical pin in a straight hole in any plastic molded part.

The multiple rings of the multiple molded-in levels of the holes 130A, 130B, as depicted in FIG. 4, give both a circumferential and vertical/horizontal change in degree of screw engagement. This provides centering of the screw, easy thread cutting since only partial and shallow threads are cut in the first ring's largest diameter levels. At lower levels deeper and more full threads will be cut by the insertion of the screw. The partial threads that are cut by the screw nearer the top of the hole, and the full threads at the bottom of the hole, serve to provide strength of engagement, and importantly, provide a large design space of possible configurations to allow for design trade-offs and optimization. There can thus be more or fewer rings and more or fewer levels circumferentially as required for a particular specification.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of aspects of the present invention to the full extent indicated by the broad general meaning of the terms in which the appended claims are expressed. For example, the particular elements may vary depending on the particular processing environment without departing from the spirit and scope herein.

Although the embodiments described herein are directed to hardware for data storage systems, it will be appreciated by those skilled in the art that the claimed subject matter is not so limited and various other processing systems can utilize the embodiments described herein without departing from the spirit and scope thereof.

What is claimed is:

1. A printed circuit board assembly comprising:
   a circuit board having opposing side edges; and
   an open frame housing comprising parallel mounting frames extending along respective side edges, each mounting frame comprising:
      an elongated body portion having a channel contactingly nesting the associated side edge, and
      first and second mounting holes extending into the body portion in respective orthogonal directions, the holes intersecting to form a continuous interior passageway through the body portion, each mounting hole having an outer tapered screw guide portion and an inner threaded portion disposed within the continuous passageway.

2. The printed circuit board assembly of claim 1 further comprising:
   a fastener adapted for advancement into a selected one of the mounting holes and into the continuous passageway to secure the open frame housing in a host system.

3. The printed circuit board assembly of claim 2 further comprising:
   a plurality of non-volatile memory chips mounted to at least one side of the circuit board; and
   a connector mounted to an end of the circuit board between the parallel mounting frames.

4. The printed circuit board assembly of claim 1 wherein the open frame housing is made of a polymeric material.

5. The printed circuit board assembly of claim 1 in which the first mounting hole extends into a first surface of the body portion, and the second mounting hole extends into a second surface of the body portion perpendicular to the first surface so that the continuous passageway extends from the first surface to the second surface.

6. A mounting apparatus for a printed circuit board having a side edge, comprising:
   a mounting frame having a body portion forming a channel contactingly nesting the side edge;
   first and second mounting holes extending into the body portion in respective orthogonal directions, the second mounting hole intersecting the first mounting hole to form a continuous interior passageway through the body portion; and
   a fastener adapted for advancement into a selected one of the first and second mounting holes and into the continuous passageway to secure the mounting frame in a host system, the fastener comprising a screw member, and the continuous interior passageway having first and second portions, the first portion having a tapered wall surface for guiding the proximal end of the screw ember along a central axis of the first mounting hole and the second portion having a tapered wall with a lesser diameter than the first portion to be threaded by the screw member as the screw member is advanced along the central axis of the first mounting hole.

7. The mounting apparatus of claim 6 wherein the mounting frame is made of a polymeric material.

8. The mounting apparatus of claim 6 wherein the printed circuit board has an opposing side edge and further comprising:
   a second mounting frame having a second body portion forming a channel contactingly nesting the opposing side edge;
   third and fourth mounting holes extending into the body portion in respective orthogonal directions, the fourth mounting hole intersecting the third mounting hole to form a continuous passageway through the second body portion, and
   a second fastener adapted for advancement into a selected one of the third and fourth mounting holes and into the continuous passageway to secure the second mounting frame in the host system, the fastener comprising a second screw member, and the continuous interior passageway having first and second portions, the first portion having a tapered wall surface for guiding the proximal end of the second screw member along a central axis of the third mounting hole and the second portion having a tapered wall with a lesser diameter than the first portion to be threaded by the second screw member as the second screw member is advanced along the central axis of the third mounting hole.

9. The mounting apparatus of claim 8 wherein the mounting frame is made of a polymeric material.

10. A printed circuit board assembly comprising:
    a printed circuit board having opposing end edges and opposing side edges;
    a multipin connector attached to a selected one of the opposing ends;
    a first mounting frame attached to a selected one of the opposing side edges; and
    a second mounting frame attached to a remaining one of the side edges, each of the first and second mounting frames characterized as a side rail of an open frame housing and having a body portion which extends along an overall length of the associated side edge and a pair of inwardly extending protrusions which project from the body portion to form a substantially u-shaped channel to contactingly nest said associated side edge, each said mounting frame further having first and second orthogonally disposed mounting bores, the first said bore extending into the body portion and the second said bore extending into a selected one of the inwardly extending protrusions to intersect the first bore and form a continuous interior passageway that extends through the body portion from the first bore to the second bore, each of the first and second bores having an unthreaded portion within the continuous passageway that tapers from a larger outermost diameter to a smaller outermost diameter.

11. The printed circuit board assembly of claim 10, in which the first bore extends along a first axial direction and the second bore extends along a second axial direction orthogonal to the first axial direction so that the continuous passageway forms a right angle within the associated body portion.

12. The printed circuit board assembly of claim 10, in which the first bore extends into a first surface of the associated first or second mounting frame and the second bore extends into a second surface of the associated frame perpendicular to the first surface so that the interior passageway continuously extends from the first surface to the second surface.

* * * * *